(12) United States Patent
Cai

(10) Patent No.: US 11,348,975 B2
(45) Date of Patent: May 31, 2022

(54) ORGANIC LIGHT-EMITTING DIODE DISPLAY SUBSTRATE, MANUFACTURING METHOD OF SAME AND DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventor: Zhenfei Cai, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/644,562

(22) PCT Filed: Dec. 13, 2019

(86) PCT No.: PCT/CN2019/125097
§ 371 (c)(1),
(2) Date: Mar. 5, 2020

(87) PCT Pub. No.: WO2021/103177
PCT Pub. Date: Jun. 3, 2021

(65) Prior Publication Data
US 2021/0159283 A1    May 27, 2021

(30) Foreign Application Priority Data
Nov. 26, 2019   (CN) .......................... 201911170444.9

(51) Int. Cl.
*H01L 27/32* (2006.01)
*H01L 51/56* (2006.01)

(52) U.S. Cl.
CPC ...... *H01L 27/3216* (2013.01); *H01L 27/3246* (2013.01); *H01L 27/3276* (2013.01);
(Continued)

(58) Field of Classification Search
CPC ............. H01L 27/3216; H01L 27/3246; H01L 27/3276; H01L 51/56; H01L 2227/323
(Continued)

(56) References Cited

U.S. PATENT DOCUMENTS

2006/0119556 A1   6/2006   Winters et al.
2014/0264357 A1*  9/2014   Chen .................... H01L 27/124
                                                        257/72
(Continued)

FOREIGN PATENT DOCUMENTS

| CN | 102914923 A | 2/2013 |
| CN | 107170747 A | 9/2017 |
| CN | 109698225 A | 4/2019 |
| CN | 110176478 A | 8/2019 |

*Primary Examiner* — Dzung Tran
(74) *Attorney, Agent, or Firm* — The Roy Gross Law Firm, LI; Roy Gross

(57) ABSTRACT

An organic light-emitting diode display substrate, a manufacturing method of the same, and an organic light-emitting diode display device are disclosed by the application. The display substrate comprises a substrate, and the substrate comprises a light-emitting region and nonlight-emitting region, wherein the light-emitting region comprises a plurality of data lines and a plurality of scan lines which are arranged in rows and columns respectively and perpendicular to each other and a plurality of pixel unit regions defined by the plurality of data lines and the plurality of scan lines, wherein each of the pixel unit regions comprises a plurality of sub-pixels, the scan lines of each of the sub-pixels in adjacent pixel unit regions of the same row are merged between the adjacent pixel unit regions, and the data lines in (Continued)

adjacent pixel unit regions of the same column are merged between the adjacent pixel unit regions.

14 Claims, 4 Drawing Sheets

(52) U.S. Cl.
CPC ........ *H01L 51/56* (2013.01); *H01L 2227/323* (2013.01); *H01L 2251/5315* (2013.01)

(58) Field of Classification Search
USPC .......................................................... 257/40
See application file for complete search history.

(56) References Cited

U.S. PATENT DOCUMENTS

| | | |
|---|---|---|
| 2015/0041776 A1 | 2/2015 | Kim |
| 2015/0325198 A1* | 11/2015 | Chen ........................ G09G 5/02 345/205 |
| 2016/0064465 A1* | 3/2016 | Oh ...................... H01L 27/1251 257/43 |
| 2016/0181339 A1* | 6/2016 | Lee ..................... H01L 27/1248 257/40 |
| 2017/0256569 A1* | 9/2017 | Ohara ................. H01L 27/1251 |
| 2017/0278901 A1* | 9/2017 | Kim .................... H01L 27/3246 |
| 2018/0210277 A1 | 7/2018 | Wang et al. |
| 2019/0355799 A1* | 11/2019 | Jeong .................. H01L 27/3262 |

\* cited by examiner

ORGANIC LIGHT-EMITTING DIODE DISPLAY SUBSTRATE, MANUFACTURING METHOD OF SAME AND DISPLAY DEVICE

BACKGROUND OF INVENTION

Field of Invention

This disclosure relates to the field of display technologies, and particularly to an organic light-emitting diode display substrate, a manufacturing method of same, and a display device.

Description of Prior Art

Compared to liquid crystal displays (LCDs), organic light-emitting diodes (OLEDs) have the advantages of self-illumination, wide viewing angles, high brightness, low power consumption, lightweight and thin thickness, and so on. Therefore, they are considered as the next-generation display technology.

OLED devices in prior art generally include an anode, a cathode, and a light-emitting layer disposed between the anode and the cathode. OLED devices can be divided into two sorts: bottom-emitting devices and top-emitting devices according to different light-emitting directions. As a higher aperture rate can be reached and a screen brightness can be significantly improved in the top-emitting devices, in recent years the top-emitting devices have become a hot research topic.

Now, excessive cathode resistance has been a difficult problem in large-sized top-emitting OLED display panels. A relatively reliable solution to solve the problem of excessive cathode resistance in panels is to form nano silver traces on a transparent cathode after a deposition of the transparent cathode to reduce the cathode resistance. However, the nano silver is not a kind of transparent material. Therefore, a nonlight-emitting region is required under the nano silver. The nonlight-emitting region has been a gate or a source/drain electrode metal trace region when corresponding to a substrate, which leads to a current pixel arrangement on the substrate shown in FIG. 1. A blue pixel light-emitting martial has a short life time and often requires a bigger aperture area, which seriously limits the horizontal layout and the line width of the nano silver. However, there is no space for nano silver printing in vertical direction. Accuracy of nano silver transfer or printing is not high. Therefore, the pixel arrangement shown in FIG. 1 is difficult to be applied in reality.

SUMMARY OF INVENTION

This application provides an organic light-emitting diode display substrate, a manufacturing method of the same and a display device which can solve the problems of low printing accuracy and printing yield induced by the pixel arrangement in the top-emitting OLED devices in prior art.

To solve above technical problems, a technical scheme applied by this application is to provide an organic light-emitting diode display substrate comprising a substrate, the substrate comprises a light-emitting region and a nonlight-emitting region, wherein the light-emitting region comprises a plurality of data lines and a plurality of scan lines which are arranged in rows and columns respectively and perpendicular to each other and a plurality of pixel unit regions defined by the plurality of data lines and the plurality of scan lines, wherein each of the pixel unit regions comprises a plurality of sub-pixels, the scan lines of each of the sub-pixels in adjacent pixel unit regions of the same row are merged between the adjacent pixel unit regions, and the data lines of each of sub-pixels in adjacent pixel unit regions of the same column are merged between the adjacent pixel unit regions.

Herein, each of the pixel unit regions comprises a first sub-pixel, a second sub-pixel and a third sub-pixel, and the first sub-pixel, the second sub-pixel and the third sub-pixel are red sub-pixel, green sub-pixel and blue sub-pixel respectively, wherein the first sub-pixel is arranged side by side with the second sub-pixel in a column direction and the third sub-pixel is arranged side by side with the second sub-pixel and the first sub-pixel and in a row direction respectively.

Herein, each of the pixel unit regions comprises a first electrode layer, a light-emitting layer and a second electrode layer stacked in sequence.

Herein, the display substrate further comprises a pixel definition layer, the pixel definition layer is formed on the anode layer, a plurality of grooves are formed corresponding to the light-emitting region and the nonlight-emitting region of the display substrate and the grooves corresponding to the nonlight-emitting region correspond to the plurality of data lines and the plurality of scan lines.

Herein, the light-emitting layer is disposed in the grooves corresponding to the light-emitting region.

Herein, the display substrate further comprises a nano silver layer, the nano silver layer is formed in the grooves of the pixel definition layer corresponding to the nonlight-emitting region.

To solve above technical problems, another technical scheme applied by this application is to provide a manufacturing method of an organic light-emitting diode display substrate comprising steps of:

providing a substrate, wherein the substrate comprises a light-emitting region and a nonlight-emitting region;

forming a plurality of data lines and a plurality of scan lines which are arranged in rows and columns respectively and perpendicular to each other, and a plurality of pixel unit regions are defined by the plurality of data lines and the plurality of scan lines in the light-emitting region, and forming a plurality of sub-pixels in the plurality of pixel unit regions defined, wherein each of the pixel unit regions comprises a plurality of sub-pixels, the scan lines of each of the sub-pixels in adjacent pixel unit regions of the same row are merged between the adjacent pixel unit regions, and the data lines of adjacent pixel unit regions of the same column are merged between the adjacent pixel unit regions.

Herein, each of the pixel unit regions comprises a first sub-pixel, a second sub-pixel and a third sub-pixel, the first sub-pixel, the second sub-pixel and the third sub-pixel are red sub-pixel, green sub-pixel and blue sub-pixel respectively, wherein the first sub-pixel is arranged side by side with the second sub-pixel in a column direction and the third sub-pixel is arranged side by side with the second sub-pixel and the first sub-pixel and in a row direction respectively.

Herein the step of forming a plurality of sub-pixels in the plurality of pixel unit regions further comprises steps of:

forming a patterned first electrode layer and a pattern pixel definition layer in sequence on the plurality of data lines and the plurality of scan lines, wherein a plurality of grooves are formed in the pixel definition layer corresponding to the light-emitting region and the nonlight-emitting region and the grooves corresponding to the nonlight-emitting region correspond to the plurality of data lines and the plurality of scan lines; and forming a light-emitting layer, a nano silver layer and a second electrode layer in sequence on the pixel definition layer, wherein the light-emitting layer is disposed in the grooves corresponding to the light-emitting region, and the nano silver layer is formed in the grooves of the pixel definition layer corresponding to the nonlight-emitting region.

To solve above technical problems, another technical scheme applied by this application is to provide an organic light-emitting diode display device, the display device comprises one of the above-mentioned organic light-emitting diode display substrates or an organic light-emitting diode display substrate manufactured by one of the above-mentioned manufacturing methods.

Advantageous effects of this application is that: compared to prior art, the organic light-emitting diode display substrate, the manufacturing method of the same, and the display device are provided by the application, the scan lines of each of the sub-pixels in adjacent pixel unit regions of the same row are merged, and the data lines of each of sub-pixels in adjacent pixel unit regions of the same column are merged. Maximization of linewidths of nano silver traces can be accomplished, and at the same time, accuracy and yield of printing nano silver traces can be improved.

BRIEF DESCRIPTION OF DRAWINGS

In order to more clearly illustrate the technical solution of embodiments of this application, a brief description of drawings that are necessary for the illustration of the embodiments of this application will be given as follows. Obviously, the drawings described below show only some embodiments of this disclosure, and a person having ordinary skill in the art may also obtain other drawings based on the drawings described without making any creative effort, herein.

DETAILED DESCRIPTION OF PREFERRED EMBODIMENTS

Hereinafter, descriptions are given with reference to drawings and embodiments. Specifically, the following embodiments are only used to explain the application, but do not limit the scope of the application. Similarly, the following embodiments are only part of the present disclosure but not all. A person having ordinary skill in the art may obtain other embodiments without making any creative effort, which all belong to the scope of the present disclosure.

The terms "first", "second" and "third" in the application are used for descriptive purposes only, and cannot be understood as indicating or implying relative importance or implying numbers of indicated technical features. Thus, a feature defined as "first", "second" and "third" may explicitly or implicitly include at least one such features. In the description of this application, "a plurality of" means at least two, such as two, three, etc., unless otherwise specified. All directional indications in the embodiments of the application (such as up, down, left, right, front, back . . . ) are only used to explain the relative position relationship, motion situation, etc. among the components under a certain state (as shown in the attached drawings). If the specific state changes, the directional indications will change accordingly. In addition, the terms "include" and "have" and any deformation of them are intended to cover nonexclusive inclusion. For example, processes, methods, systems, products or devices that contain a series of steps or units are not limited to the listed steps or units, but optionally also include the steps or units that are not listed, or optionally include other steps or units that are inherent in these processes, methods, products or devices.

Referring to "embodiments" herein means that specific features, structures or characteristics described with reference to embodiments may be included in at least one embodiments of the application. The presence of the phrase at various locations in the specification does not necessarily mean the same embodiment, nor is it an independent or alternative embodiment mutually exclusive with other embodiments. It is explicitly and implicitly understood by those skilled in the art that the embodiments described herein may be combined with other embodiments.

Figure 1:
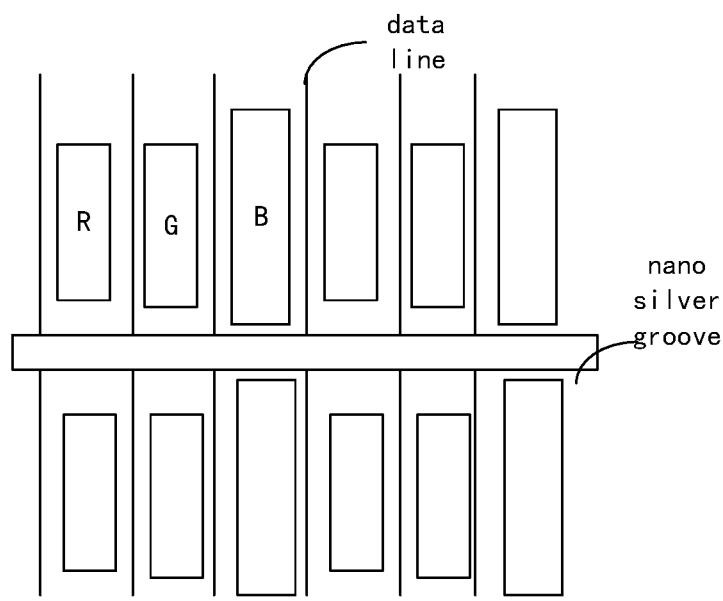
FIG. 1 is a structural diagram of an arrangement of one embodiment of pixel units of light-emitting regions of an OLED in prior art.
Figure 2:
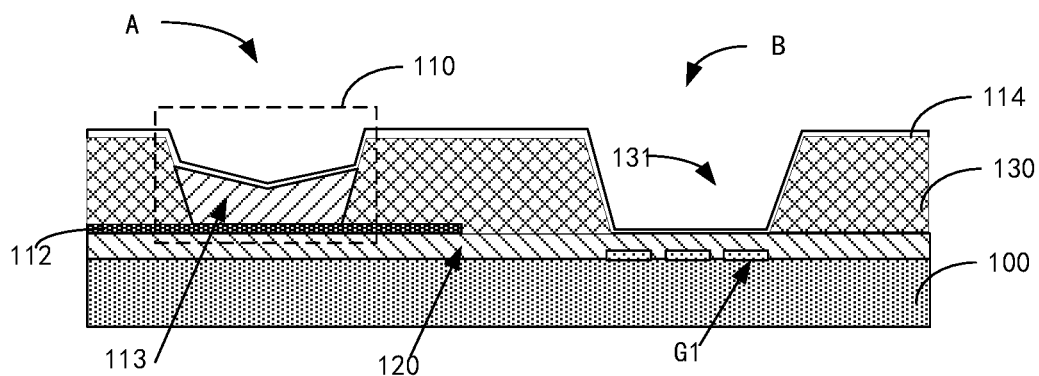
FIG. 2 is a structural diagram of one embodiment of an organic light-emitting diode display substrate according to this application.

Please refer to FIG. 2. FIG. 2 is a structural diagram of one embodiment of an organic light-emitting diode display substrate according to this application. As shown in FIG. 2, the organic light-emitting diode display substrate provided by this application includes a substrate 100. Herein, the substrate 100 can be defined as a transparent material. Specifically, it can be defined as a substrate in any form, such as a glass substrate, a ceramic substrate, or a transparent plastic substrate and so on. Herein, no specific limitation is made in this application, and in this embodiment, a glass substrate is applied as the substrate 100.

Optionally, the substrate 100 includes a light-emitting region A and a nonlight-emitting region B.

Figure 3:
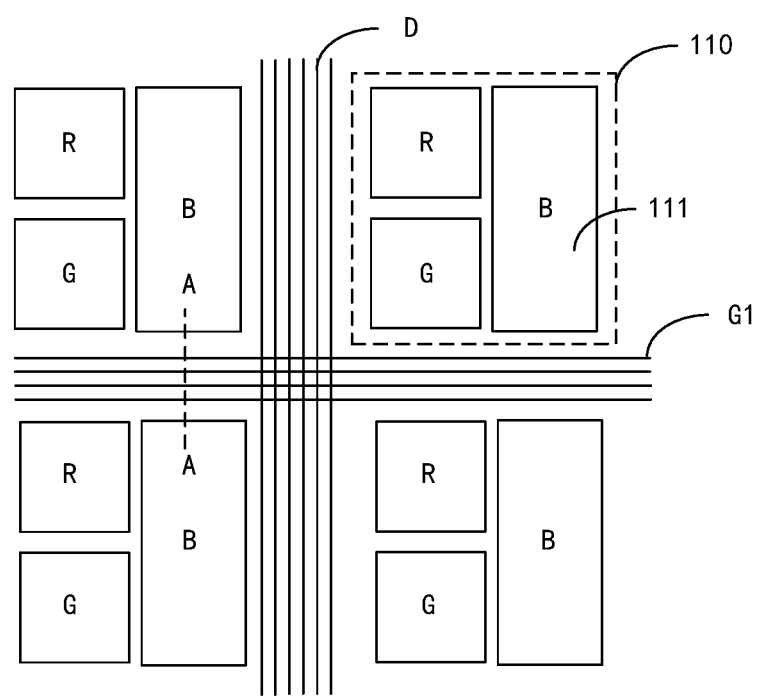
FIG. 3 is a structural diagram of an arrangement of one embodiment of pixel unit regions of light-emitting regions of an OLED according to this application.

Further referring to FIG. 3, FIG. 3 is a structural diagram of an arrangement of one embodiment of pixel unit regions of light-emitting regions of an OLED according to this application. Herein, the light-emitting region A comprises a plurality of data lines D and a plurality of scan lines G1 which are arranged in rows and columns respectively and perpendicular to each other and a plurality of pixel unit regions 110 defined by the plurality of data lines and the plurality of scan lines, wherein each of the pixel unit regions 110 comprises a plurality of sub-pixels 111, the scan lines G1 of each of sub-pixels 111 in adjacent pixel unit regions 110 of the same row are merged to a single row and located between the adjacent pixel unit regions 110, and the data lines D of adjacent pixel unit regions 110 of the same column are merged to a single column and located between the adjacent pixel unit regions 110.

Furthermore, a plurality of sub-pixels 111 of each of the pixel unit regions 110 in this application include a first sub-pixel, a second sub-pixel, and a third sub-pixel. Herein, the first sub-pixel is defined as a red sub-pixel R, the second sub-pixel is defined as a green sub-pixel G, and the third sub-pixel is defined as a blue sub-pixel B.

In this application, the first sub-pixel is arranged side by side with the second sub-pixel in a column direction (that is an extending direction of the data lines D), and the third sub-pixel is arranged side by side with the first sub-pixel and the second sub-pixel in a row direction which is vertical to the column direction (that is an extending direction of the scan lines G1). The scan lines G1 of each of sub-pixels 111 in adjacent pixel unit regions 110 of the same row are merged and the data lines D of each of sub-pixels 111 in adjacent pixel unit regions 110 of the same column are merged. Maximization of linewidths of nano silver traces can be accomplished, and at the same time, accuracy and yield of printing nano silver traces can be improved.

Further referring to FIG. 2, each of the pixel unit regions 110 of the light-emitting region A comprises a first electrode layer 112, a light-emitting layer 113, and a second electrode layer 114 stacked in sequence. Herein, the first electrode layer 112 and the second electrode layer 114 are an anode layer and a cathode layer, respectively. The first electrode layer 112 is a transmitting electrode with a metal reflecting layer, which can be specifically made of materials such as metal, metal alloy, indium tin oxide (ITO for short), indium zinc oxide (IZO for short:), or Al doped ZnO (AZO for short) and so on. The second electrode layer 114 is a transparent conductive material, which can be defined as an alloy of Ag and one or more of Mg, Li, K, CA, Na, Sr, CS, Ba, or Yb and so on.

Optionally, further referring to FIG. 2, the organic light-emitting diode display substrate according to this application further comprises a buffer layer (not shown in drawings), an insulating layer 120, a thin film transistor layer (not shown in drawings), and a planarization layer (not shown in drawings). It can be understood that the buffer layer, the insulating layer 120, the thin film transistor layer, and the planarization layer in this application can be prepared by various preparation methods well known in the industry. A material of the insulating layer 120 can be defined as a photosensitive insulating organic resin. The buffer layer is used to block the penetration of foreign substances or water. A material applied can be defined as one of silicon nitride (SiNx) and silicon dioxide (SiO2). Certainly, it also can be defined as other materials. No specific restrictions are made here.

Specifically, the first electrode layer 112 is formed on the insulating layer 120.

Optionally, the display substrate further comprises a pixel definition layer 130. The pixel definition layer 130 is formed on the first electrode layer 112. And a plurality of grooves 131 are formed corresponding to the light-emitting region A and the nonlight-emitting region B of the display substrate, wherein the grooves corresponding to the nonlight-emitting region B corresponds to the plurality of data lines D and the plurality of scan lines G1.

Herein, the pixel definition layer 130 can include an organic insulating layer (not shown in drawings) and a conductive layer (not shown in drawings). The conductive layer can be connected to the second electrode layer 114. By configuring the conductive layer connected to the cathode in the pixel definition layer, parallel connection of the conductive layer and the second electrode layer 114 can be accomplished, which leads to a cathode resistance of this embodiment not only less than the cathode resistance in prior art but also less than the resistance of the second electrode layer 114.

Optionally, the light-emitting layer 113 is disposed in the grooves 131 corresponding to the light-emitting region A.

Furthermore, the display substrate also includes a nano silver layer (not shown in drawings), the nano silver layer is formed in the grooves 131 of the pixel definition layer 130, the grooves correspond to the nonlight-emitting region B, and correspond to the gate scan lines S on the substrate 110. Optionally, the nano silver layer in this application can be formed by ink-jet printing or transfer. Herein, a printer with high precision and a small nozzle can be selected to print the nano silver ink in corresponding grooves in form of small droplets. And then the display substrate is placed in a negative pressure environment. The solvent inside the nano silver ink is volatilized in the negative pressure environment, and the nano silver is precipitated to form the nano silver layer.

Optionally, the second electrode layer 114 covers the nano silver layer, the pixel definition layer 130, and the light emitting layer 113.

Certainly, the nano silver layer can also be formed in grooves of the second electrode layer 114 corresponding to the nonlight-emitting region B in other embodiments.

It can be understood that when preparing the pixel units of the light-emitting regions, the first sub-pixel is arranged side by side with the second sub-pixel in the column direction (that is an extending direction of the data lines D), and the third sub-pixel is arranged side by side with the first sub-pixel and the second sub-pixel in the row direction (that is an extending direction of the scan lines G1) of the pixel units. The scan lines G1 of each of sub-pixels 111 in adjacent pixel unit regions 110 of the same row are merged and the data lines D of each of sub-pixels 111 in adjacent pixel unit regions 110 of the same column are merged. Maximization of linewidths of nano silver traces can be accomplished, and at the same time, accuracy and yield of printing nano silver traces can be improved.

According to the above embodiment, the scan lines of each of the sub-pixels in adjacent pixel unit regions of the same row are merged and the data lines of each of sub-pixels in adjacent pixel unit regions of the same column are merged. Maximization of linewidths of nano silver traces can be accomplished, and at the same time, accuracy and yield of printing nano silver traces can be improved.

Figure 4:
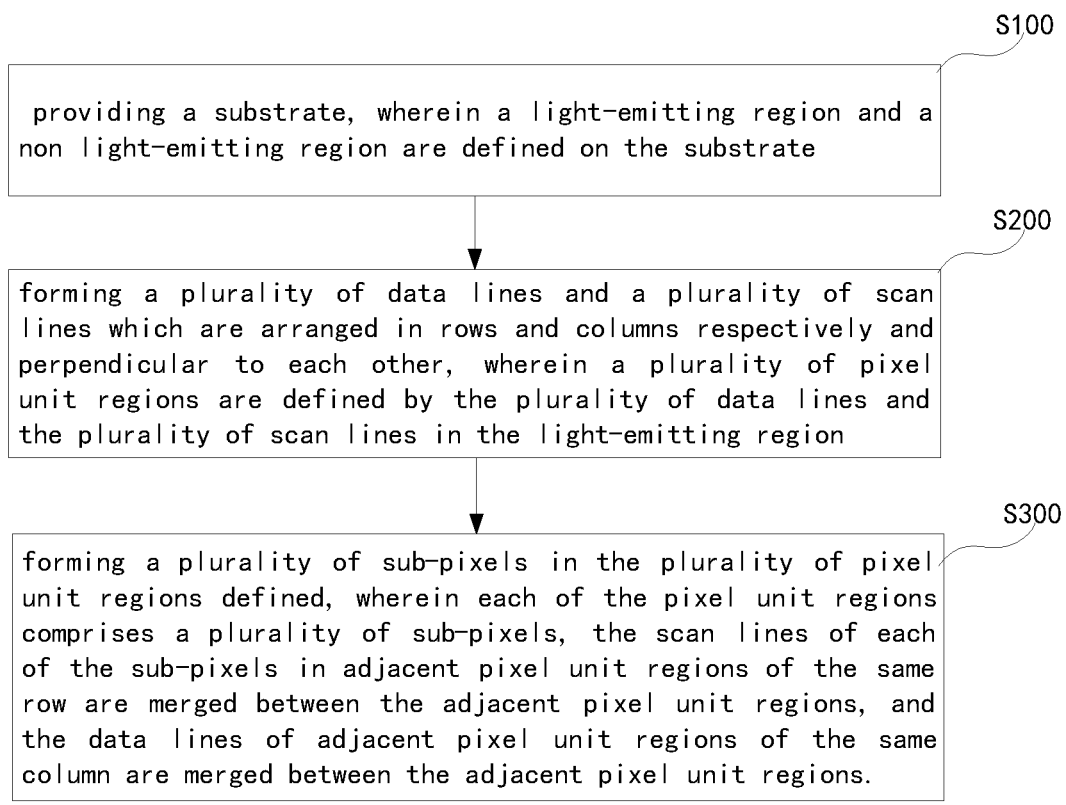
FIG. 4 is a flow chart of one embodiment of a manufacturing method of the organic light-emitting diode display substrate according to this application.

Please refer to FIG. 4. FIG. 4 is a flow chart of one embodiment of a manufacturing method of the organic light-emitting diode display substrate according to this application. As shown in FIG. 4, a manufacturing method of an organic light-emitting diode display substrate comprises steps of:

A step S100 of providing a substrate, wherein the substrate comprises a light-emitting region and a nonlight-emitting region.

Combining with FIG. 2 and FIG. 3, the substrate 100 can be defined as a transparent material. Specifically, it can be defined as a substrate in any from such as a glass substrate, a ceramic substrate, or a transparent plastic substrate and so on. The substrate 100 comprises a light-emitting region A and a nonlight-emitting region B which are defined.

A step S200 of forming a plurality of data lines and a plurality of scan lines which are arranged in rows and columns respectively and perpendicular to each other, and a plurality of pixel unit regions are defined by the plurality of data lines and the plurality of scan lines in the light-emitting region.

Optionally, a plurality of data lines D and a plurality of scan lines G1 which are arranged in rows and columns respectively and perpendicular to each other are formed. Optionally, a plurality of pixel unit regions 110 are defined by the plurality of data lines D and the plurality of scan lines G1 in the light-emitting region A.

A step S300 of forming a plurality of sub-pixels in the plurality of pixel unit regions defined, wherein each of the pixel unit regions comprises a plurality of sub-pixels, the scan lines of each of the sub-pixels in adjacent pixel unit regions of the same row are merged between the adjacent pixel unit regions, and the data lines of adjacent pixel unit regions of the same column are merged between the adjacent pixel unit regions.

Optionally, each of the pixel unit regions 110 comprises a plurality of sub-pixels 111, the scan lines G1 of each of sub-pixels 111 in adjacent pixel unit regions 110 of the same row are merged to a single row and located between the adjacent pixel unit regions 110, and the data lines D of adjacent pixel unit regions 110 of the same column are merged to a single column and located between the adjacent pixel unit regions 110.

Furthermore, FIG. 3 is taken as an example to provide a detail description. A plurality of sub-pixels 111 of each of the pixel unit regions 110 according to this application include a first sub-pixel, a second sub-pixel, and a third sub-pixel, wherein the first sub-pixel is defined as a red sub-pixel R, the second sub-pixel is defined as a green sub-pixel G, and the third sub-pixel is defined as a blue sub-pixel B.

In this application, the first sub-pixel is arranged side by side with the second sub-pixel in a column direction (that is an extending direction of the data lines D) and the third sub-pixel is arranged side by side with the first sub-pixel and the second sub-pixel in a row direction (that is an extending direction of the scan lines G1). The scan lines G1 of each of sub-pixels 111 in adjacent pixel unit regions 110 of the same row are merged and the data lines D of each of sub-pixels 111 in adjacent pixel unit regions 110 of the same column are merged. And the lines are input into the sub-pixels through a gap between the first sub-pixel, the red sub-pixel R and the second sub-pixel, the green sub-pixel G Maximization of linewidths of nano silver traces can be accomplished in the following process of preparing the nano silver traces, and at the same time, accuracy and yield of printing nano silver traces can be improved.

Figure 5:
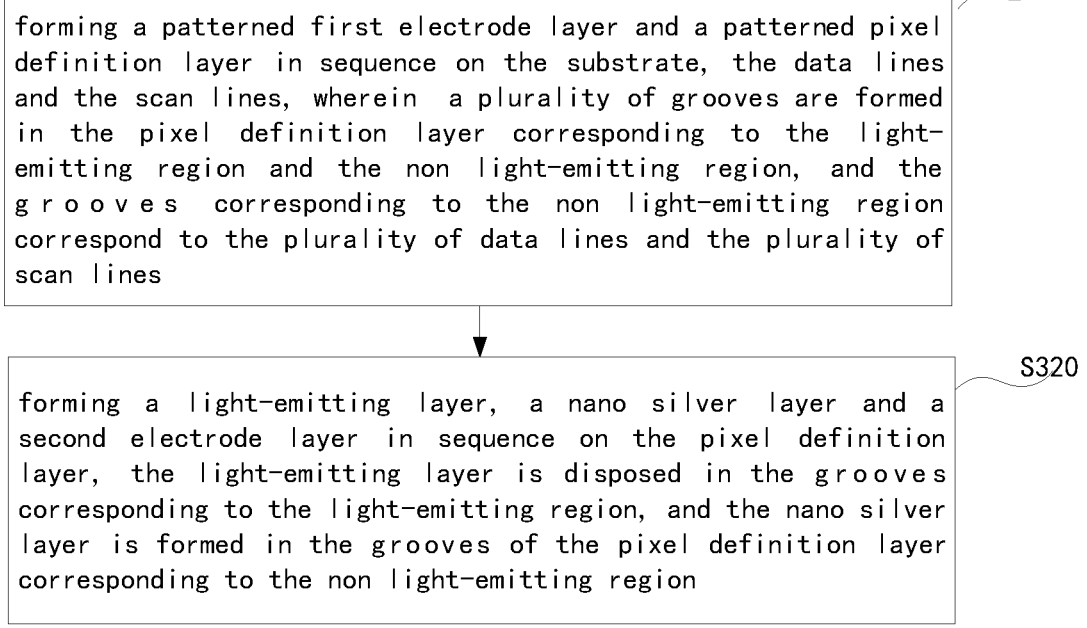
FIG. 5 is a flow chart of one embodiment of step S300 according to this application.

Combing with FIG. 5, the step S300 further comprises sub-steps of:

A step S310 of forming a patterned first electrode layer and a patterned pixel definition layer in sequence on the plurality of data lines and the plurality of scan lines, wherein a plurality of grooves are formed in the pixel definition layer corresponding to the light-emitting region and the nonlight-emitting region of the display substrate, and the grooves corresponding to the nonlight-emitting region correspond to the plurality of data lines and the plurality of scan lines.

Optionally, a patterned first electrode layer 112 and a pattern pixel definition layer 130 are formed in sequence on the plurality of data lines D and the plurality of scan lines G1, wherein a plurality of grooves 131 are formed in the pixel definition layer 130 corresponding to the light-emitting region A and the nonlight-emitting region B of the display substrate, and the grooves 131 corresponding to the non-light-emitting region B correspond to the plurality of data lines D and the plurality of scan lines G1. Herein, the pixel definition layer 130 can include an organic insulating layer (not shown in drawings) and a conductive layer (not shown in drawings). The conductive layer can be connected to the second electrode layer 114. By configuring the conductive layer connected to the cathode in the pixel definition layer, parallel connection of the conductive layer and the second electrode layer 114 can be accomplished, which leads to a cathode resistance of this embodiment not only less than the cathode resistance in prior art but also less than the resistance of the second electrode layer 114.

A step S320 of forming a light-emitting layer, a nano silver layer, and a second electrode layer in sequence on the pixel definition layer, wherein the light-emitting layer is disposed in the grooves corresponding to the light-emitting region, and the nano silver layer is formed in the grooves of the pixel definition layer corresponding to the nonlight-emitting region.

Optionally, the light-emitting layer 113 is disposed in the grooves 131 corresponding to the light-emitting region A.

Herein the display substrate also includes a nano silver layer (not shown in drawings), the nano silver layer is formed in the grooves 131 of the pixel definition layer 130, the grooves 131 correspond to the nonlight-emitting region B, corresponding to the gate scan lines S on the substrate 110. Optionally, the nano silver layer in this application can be formed by ink-jet printing or transfer. Herein, a printer with high precision and a small nozzle can be selected to print the nano silver ink in corresponding grooves in form of small droplets. And then the display substrate is placed in a negative pressure environment. The solvent inside the nano silver ink is volatilized in the negative pressure environment, and the nano silver is precipitated to form the nano silver layer. In other embodiments, the nano silver layer can also be formed in grooves of the second electrode layer 114 corresponding to the nonlight-emitting region B in other embodiments.

Optionally, the second electrode layer 114 covers the nano silver layer, the pixel definition layer 130, and the light emitting layer 113.

According to the above embodiment, the scan lines of each of the sub-pixels in adjacent pixel unit regions of the same row are merged and the data lines of each of sub-pixels in adjacent pixel unit regions of the same column are merged. Maximization of linewidths of nano silver traces can be accomplished, and at the same time, accuracy and yield of printing nano silver traces can be improved.

Figure 6:
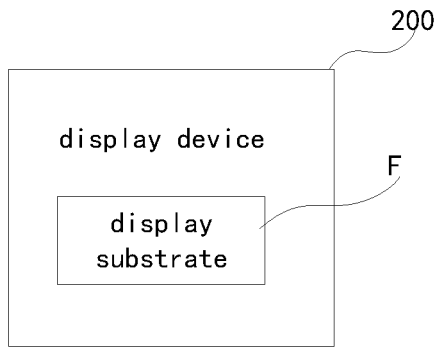
FIG. 6 is a structural diagram of one embodiment of a display device according to this application.

Please refer to FIG. 6. FIG. 6 is a structural diagram of one embodiment of a display device according to this application. An organic light-emitting diode display device 200 according to this application comprises an organic light-emitting diode display substrate F according to any of the above-mentioned embodiments. And please refer to the above detail description about the structure and the manufacturing method of the display substrate F, so detail description is omitted herein.

According to above embodiment, those skilled in art may understand that the organic light-emitting diode display substrate, the manufacturing method of the same and the display device are provided by the application, the scan lines of each of the sub-pixels in adjacent pixel unit regions of the same row are merged and the data lines of each of sub-pixels in adjacent pixel unit regions of the same column are merged. Maximization of linewidths of nano silver traces can be accomplished, at the same time, accuracy and yield of printing nano silver traces can be improved.

The above is only the embodiments of the application, and does not limit the patent scope of the application. Any transformation of equivalent structure or equivalent process made by using the content of the description and drawings of the application, or direct or indirect applications in other related technical fields are included in the protection scope of the patent of the application in the same way.

What is claimed is:

1. An organic light-emitting diode display substrate comprising a substrate, wherein the substrate comprises a light-emitting region and a nonlight-emitting region;

wherein the light-emitting region comprises a plurality of data lines and a plurality of scan lines which are arranged in rows and columns respectively and perpendicular to each other and a plurality of pixel unit regions defined by the plurality of data lines and the plurality of scan lines, wherein each of the pixel unit regions comprises a plurality of sub-pixels, the scan lines of each of the sub-pixels in adjacent pixel unit regions of a same column are merged between the adjacent pixel unit regions, and the data lines of each of the sub-pixels in adjacent pixel unit regions of a same row are merged between the adjacent pixel unit regions.

2. The display substrate of claim 1, wherein each of the pixel unit regions comprises a first sub-pixel, a second sub-pixel, and a third sub-pixel, and the first sub-pixel, the second sub-pixel, and the third sub-pixel are red sub-pixel, green sub-pixel, and blue sub-pixel respectively;

wherein the first sub-pixel is arranged side by side with the second sub-pixel in a column direction and the third sub-pixel is arranged side by side with the second sub-pixel and the first sub-pixel and in a row direction respectively.

3. An organic light-emitting diode display device comprising an organic light-emitting diode display substrate, wherein the display substrate comprises a substrate, and the substrate comprises a light-emitting region and a nonlight-emitting region, wherein the light-emitting region comprises a plurality of data lines and a plurality of scan lines which are arranged in rows and columns respectively and perpendicular to each other and a plurality of pixel unit regions defined by the plurality of data lines and the plurality of scan lines, wherein each of the pixel unit regions comprises a plurality of sub-pixels, the scan lines of each of the sub-pixels in adjacent pixel unit regions of a same column are merged between the adjacent pixel unit regions, and the data lines of each of the sub-pixels in adjacent pixel unit regions of a same row are merged between the adjacent pixel unit regions.

4. The display device of claim 3, wherein each of the pixel unit regions comprises a first sub-pixel, a second sub-pixel, and a third sub-pixel, and the first sub-pixel, the second sub-pixel, and the third sub-pixel are red sub-pixel, green sub-pixel, and blue sub-pixel respectively, wherein, the first sub-pixel is arranged side by side with the second sub-pixel in a column direction and the third sub-pixel is arranged side by side with the second sub-pixel and the first sub-pixel and in a row direction respectively.

5. The display device of claim 3, wherein each of the pixel unit regions comprises a first electrode layer, a light-emitting layer, and a second electrode layer stacked in sequence.

6. The display substrate of claim 2, wherein four scan lines are merged between the adjacent pixel unit regions of a same column, and six data lines are merged between the adjacent pixel unit regions of a same row.

7. The display substrate of claim 6, wherein each of the pixel unit regions comprises a first electrode layer, a light-emitting layer, and a second electrode layer stacked in sequence.

8. The display substrate of claim 7, wherein the display substrate further comprises a pixel definition layer, the pixel definition layer is formed on the first electrode layer, a plurality of grooves are formed corresponding to the light-emitting region and the nonlight-emitting region of the display substrate, and the grooves corresponding to the nonlight-emitting region correspond to the plurality of data lines and the plurality of scan lines.

9. The display substrate of claim 8, wherein the light-emitting layer is disposed in the grooves corresponding to the light-emitting region.

10. The display substrate of claim 8, wherein the display substrate further comprises a nano silver layer, the nano silver layer is formed in the grooves of the pixel definition layer corresponding to the nonlight-emitting region.

11. The display substrate of claim 4, wherein four scan lines are merged between the adjacent pixel unit regions of a same column, and six data lines are merged between the adjacent pixel unit regions of a same row.

12. The display device of claim 11, wherein the display substrate further comprises a pixel definition layer, the pixel definition layer is formed on the first electrode layer, a plurality of grooves are formed corresponding to the light-emitting region and the nonlight-emitting region of the display substrate, and the grooves corresponding to the nonlight-emitting region correspond to the plurality of data lines and the plurality of scan lines.

13. The display device of claim 12, wherein the light-emitting layer is disposed in the grooves corresponding to the light-emitting region.

14. The display device of claim 12, wherein the display substrate further comprises a nano silver layer, the nano silver layer is formed in the grooves of the pixel definition layer corresponding to the nonlight-emitting region.

* * * * *